(12) United States Patent
Rothkopf et al.

(10) Patent No.: US 9,386,704 B2
(45) Date of Patent: Jul. 5, 2016

(54) HANDHELD DEVICE ASSEMBLY

(71) Applicant: Apple Inc., Cupertino, CA (US)

(72) Inventors: Fletcher Rothkopf, Los Altos, CA (US); Stephen B. Lynch, Portola Valley, CA (US); Wey-Jiun Lin, Los Altos, CA (US); Kyle Yeates, Mountain Way, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/203,245

(22) Filed: Mar. 10, 2014

(65) Prior Publication Data
US 2014/0192488 A1    Jul. 10, 2014

Related U.S. Application Data

(63) Continuation of application No. 12/555,388, filed on Sep. 8, 2009, now Pat. No. 8,670,588.

(51) Int. Cl.
*H05K 1/18* (2006.01)
*H01M 2/10* (2006.01)
*H05K 9/00* (2006.01)

(52) U.S. Cl.
CPC .............. *H05K 1/189* (2013.01); *H01M 2/1016* (2013.01); *H01M 2/1094* (2013.01); *H05K 9/0022* (2013.01); *H05K 9/0024* (2013.01); *Y10T 29/49826* (2015.01)

(58) Field of Classification Search
CPC ... H01L 23/552; H01L 23/5387; H05K 1/189
USPC .................................................. 381/312–331
See application file for complete search history.

(56) References Cited

U.S. PATENT DOCUMENTS

| | | | | |
|---|---|---|---|---|
| 5,519,578 A * | 5/1996 | Fujii | ...................... | H05K 1/189 174/254 |
| 5,740,527 A * | 4/1998 | Mitama | ................ | H04B 1/3827 361/818 |
| 6,208,521 B1 * | 3/2001 | Nakatsuka | .......... | H01L 23/5387 174/254 |
| 6,300,679 B1 * | 10/2001 | Mukerji | .............. | H01L 23/4985 257/686 |
| 6,699,730 B2 * | 3/2004 | Kim | ..................... | H01L 23/5387 257/E23.177 |
| 6,998,704 B2 * | 2/2006 | Yamazaki | ........... | H01L 23/4985 257/685 |
| 7,202,552 B2 * | 4/2007 | Zhe | ..................... | B81C 1/00309 257/659 |
| 7,393,226 B2 * | 7/2008 | Clayton | ................ | H01L 23/473 257/E23.098 |
| 7,519,350 B2 | 4/2009 | Yamamoto et al. | | |
| 7,595,550 B2 * | 9/2009 | Cady | ................... | H01L 23/3114 257/685 |
| 8,093,509 B2 * | 1/2012 | Hsu | ................... | H01L 27/14618 174/254 |
| 8,278,141 B2 * | 10/2012 | Chow | .................... | H01L 21/563 438/106 |
| 8,634,204 B2 * | 1/2014 | Rothkopf | ............... | H01L 25/50 174/254 |
| 2001/0040793 A1 * | 11/2001 | Inaba | .................. | H01L 23/5387 361/749 |
| 2003/0193283 A1 | 10/2003 | Aoki | | |
| 2004/0238931 A1 * | 12/2004 | Haba | ................... | H01L 23/5387 257/686 |
| 2005/0095745 A1 * | 5/2005 | Sapir | ..................... | H01L 21/822 438/106 |
| 2005/0280138 A1 * | 12/2005 | Shrivastava | ............ | H01L 23/50 257/697 |
| 2006/0033217 A1 * | 2/2006 | Taggart | ............... | H01L 23/5387 257/778 |

(Continued)

*Primary Examiner* — Matthew Eason
(74) *Attorney, Agent, or Firm* — Brownstein Hyatt Farber Schreck, LLP (57) ABSTRACT

This is directed to several handheld device components to be placed in a handheld device, as well as methods or systems for mounting or retaining components within the device. In particular, this is directed to a rigid shield used in an SMT process and securing connected flex connectors by adhering the flexes together. This is also directed to using foam in combination with a hard material to create an acoustic seal, or several layers of foam to create an acoustic and mechanical seal. This is also directed to selectively folding a sheet of material placed around a battery cell.

19 Claims, 5 Drawing Sheets

(56) References Cited

U.S. PATENT DOCUMENTS

| | | | |
|---|---|---|---|
| 2006/0043562 A1* | 3/2006 | Watanabe | H01L 23/5387 257/686 |
| 2007/0119620 A1* | 5/2007 | Rodriguez | H05K 1/0218 174/378 |
| 2009/0168363 A1* | 7/2009 | Clayton | H05K 1/189 361/714 |
| 2009/0201652 A1* | 8/2009 | Chew | H05K 1/0218 361/749 |
| 2012/0292750 A1* | 11/2012 | Chow | H01L 21/563 257/659 |
| 2014/0192488 A1* | 7/2014 | Rothkopf | H05K 9/0024 361/749 |
| 2015/0098196 A1* | 4/2015 | Palmer | H05K 3/284 361/749 |

* cited by examiner

HANDHELD DEVICE ASSEMBLY

CROSS-REFERENCE TO RELATED APPLICATIONS

This application is a continuation patent application of U.S. patent application Ser. No. 12/555,388, filed Sep. 8, 2009 and titled "Handheld Device Assembly," now U.S. Pat. No. 8,670,588, the disclosure of which is hereby incorporated herein by reference in its entirety.

BACKGROUND

This is directed to particular components and the assembly of particular components in a handheld electronic device.

A portable electronic device can include a large number of components that must be placed within a housing. Although some of the components can be small, each component can have restrictions regarding the manner in which it must be positioned, or restrictions regarding the interaction of a component with other device components. These limitations or restrictions can require innovative solutions for placing and securing components within a handheld device housing, especially when the housing includes unique or unusual features or shapes.

SUMMARY

This is directed to several handheld device components to be placed in a handheld device, as well as methods or systems for mounting or retaining components within the device.

Some device components can be coupled to a flex using SMT or other technologies. Because SMT requires a hard or rigid surface on which to operate, a rigid board may be placed behind the flex to ensure that the device components are properly mounted. When the device components must also be isolated from other components for electromagnetic interference reasons, a metal can or shield may be placed around the component. To reduce the total space required by the component and shield in the device, the rigid board can be selected from a metallic material to simultaneously provide a rigid board for SMT mounting as well as a shield from electromagnetic interference.

A handheld electronic device can include several connectors used to couple different device components. The connectors can each be coupled to separate circuit boards or flexes and positioned such that the connectors interact. The connectors, however, may disconnect during shock or drop events. To eliminate this issue, the flexes or circuit boards can be connected using an adhesive around the connectors to secure the connectors in a coupled position.

In some cases, the electronic device housing can include a component that needs an acoustic or mechanical seal. For example, a speaker coupled to a housing may need a mechanical seal to ensure proper functioning of the speaker. When the component is placed against a curved or arbitrarily shaped surface (e.g., a non-planar or non-circular surface), such as a curved surface of a rear housing of the device, it may be difficult to provide a seal using a single material. For example, a hard material that can be easily molded into an arbitrary shape can be sensitive to pressure or forces applied to the material (e.g., when other components press against the material), while softer materials that are less susceptible to failure when pressures or forces are applied may be difficultly shaped to match arbitrary or curved shapes. Instead, the device can use a combination of a hard material molded to match the arbitrary shape of the housing and a soft material operative to deflect and absorb applied forces to form a seal for the component.

Many batteries are constructed from a primary cell around which a thin sheet of material is wrapped. In many cases, the sheet of material is wrapped around the cell such that material is sealed around three sides of the cell. The excess material forming the seal can then be left flat or folded up, based on the space needs within the device. In some cases, however, other components in the device may be positioned such that the excess material cannot be left either flat or simply folded up. Instead, parts of the material may remain flat, while other parts may be folded up.

BRIEF DESCRIPTION OF THE DRAWINGS

The above and other features of the present invention, its nature and various advantages will be more apparent upon consideration of the following detailed description, taken in conjunction with the accompanying drawings in which.

DETAILED DESCRIPTION

Figure 1:
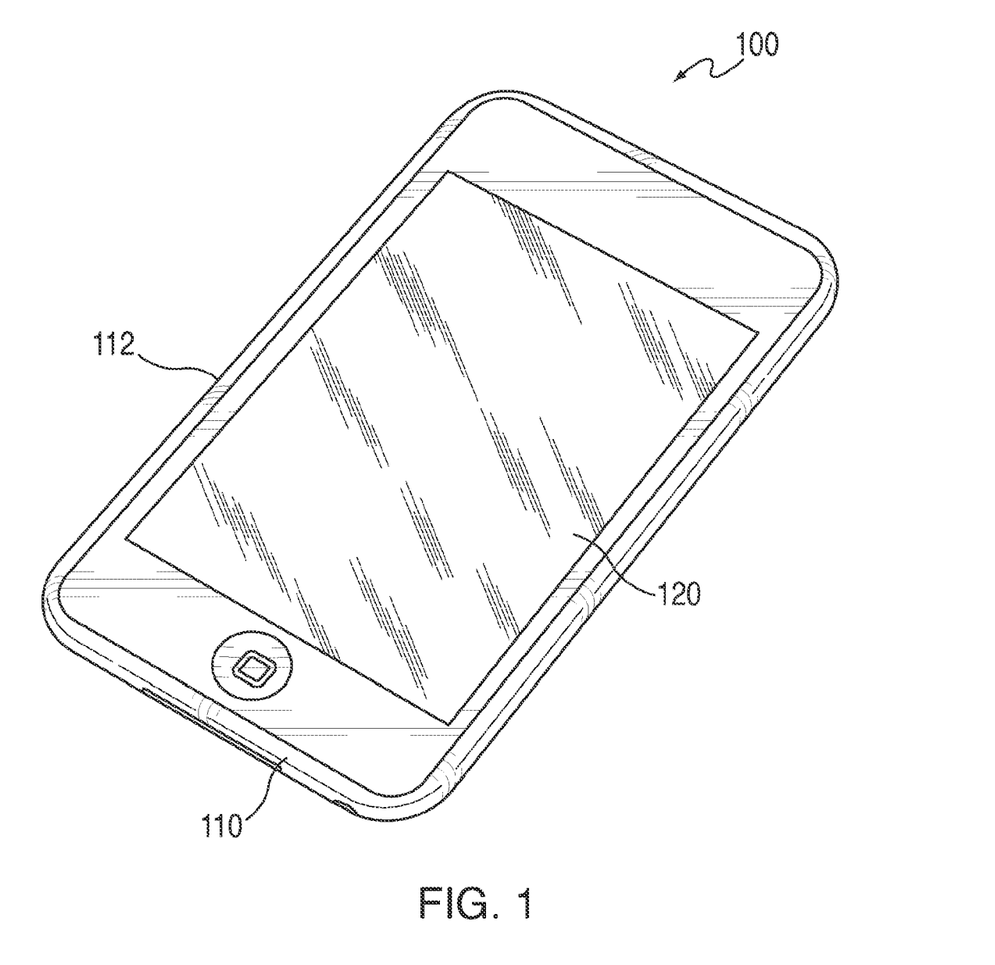
FIG. 1 is a schematic view of an illustrative electronic device in accordance with one embodiment of the invention.

FIG. 1 is a schematic view of an electronic device in accordance with one embodiment of the invention. Electronic device 100 can include housing 110, bezel 112, and window 120. Bezel 112 can be coupled to housing 110 in a manner to secure window 120 to the bezel. Housing 110 and bezel 112 can be constructed from any suitable material, including for example plastic, metal, or a composite material. Window 120 can be constructed from any suitable transparent or translucent material, including for example glass or plastic. Different electronic device components can be retained within electronic device 100 to provide different functionality to the user.

Figure 2:
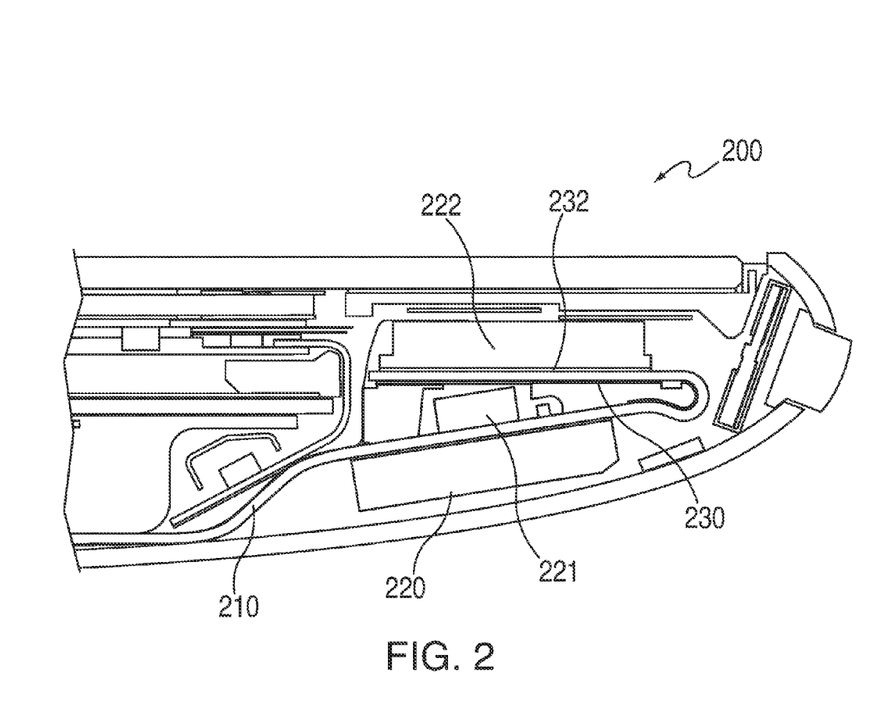
FIG. 2 is a cross-sectional view of an illustrative electronic device having components coupled to a flex in accordance with one embodiment of the invention.

Any type or number of components can be stored and retained within electronic device 100. In some embodiments, electronic device 100 can include components that are connected to a flex. FIG. 2 is a cross-sectional view of an illustrative electronic device having components coupled to a flex in accordance with one embodiment of the invention. Electronic device 200 can include several elements, including flex 210 on which components 220, 221 and 222 are mounted. Components 220, 221 and 222 can be mounted to flex 210 using any suitable approach, including for example via soldering or SMT. When SMT is used, a rigid plate may be placed behind flex 210 such that flex 210 is between the plate and the component to ensure that the SMT process provides an electrically conductive and mechanically sound coupling.

The plate can be permanently or temporarily coupled to the flex. For example, plate 230 is positioned between flex 210 and component 222 such that coupling layer 232 (e.g., a layer of solder) electrically coupled component 222 to flex 210.

Plate 230 can be constructed from any suitable material. In some embodiments, the material used for plate 230 can be selected based on secondary criteria, for example related to the particular components coupled to flex 210. In one implementation, for example, component 220 can include a component that is generates noise or electromagnetic waves that can interfere with other components. For example, component 220 can include a communications module (e.g., a WiFi module) and component 221 can include a WiFi module inductor, both of which can generate electromagnetic radiation or other noise. Component 222 can include a component that is sensitive to noise, and that must therefore be shielded from components 220 and 221. Instead of adding a metallic cage or shield around component 222, or at least between component 222 and components 220 and 221, the electronic device can select the material used for plate 230 such that plate 230 can simultaneously serve as a plate for the SMT process as well as a shield for preventing noise generated by components 220 and 221 from reaching component 222. Plate 230 can be constructed from any suitable material, including for example a metal or other conductive material (e.g., austenitic steel).

Figure 3:
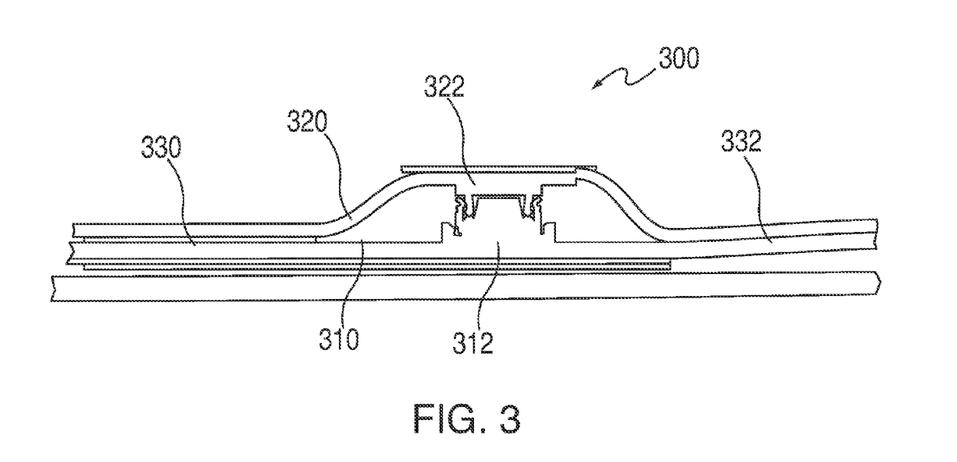
FIG. 3 is a cross-sectional view of connectors used in an electronic device in accordance with one embodiment of the invention.

In some cases, components of the electronic device can be coupled to each other via connectors associated with the device components. For example, connectors can be connected to one or more flexes and circuit boards (e.g., PCBs) and positioned such that opposing connectors can be coupled. If a connector is connected to a flex and engaged with a counterpart connector in an opposing flex or circuit board, the flex may not adequately retain the connector (e.g., keep the connector coupled to its counterpart) because the flex lacks rigidity. This can cause the connectors to disengage, for example during a shock or drop event. FIG. 3 is a cross-sectional view of connectors used in an electronic device in accordance with one embodiment of the invention. Electronic device 300 can include flex 310 (e.g., a primary or top flex of the device) and flex 320 (e.g., a secondary flex associated with a specific component, such as an antenna). To electrically couple flexes 310 and 320, each flex can include counterpart connectors 312 and 322, respectively. Connectors 312 and 322 can include any suitable mechanism for engaging each other, including for example one or more mechanical snaps or other coupling mechanisms.

To ensure that the connectors remain in contact upon assembly, flexes 310 and 320 can be coupled to each other around connectors 312 and 330. For example, adhesive 330 and 332 (e.g., a pressure sensitive adhesive) can be placed on opposite sides of connectors 312 and 322 to connect flexes 310 and 320. Flexes 310 and 320 can be connected such that there is insufficient play between the flexes for connectors 312 and 322 to disengage.

Figure 4:
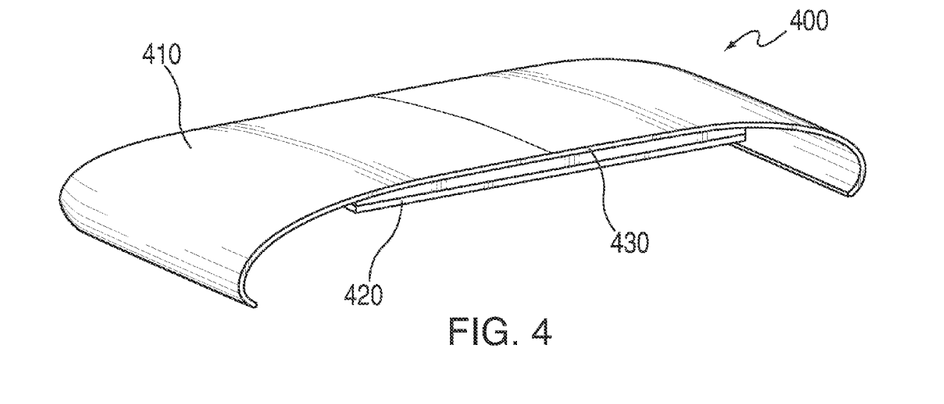
FIG. 4 is a schematic view of an illustrative device housing and seal in accordance with one embodiment of the invention.

In some cases, an electronic device can include a component that needs to be acoustically sealed, mechanically sealed, or both relative to other components of the device. For example, an electronic device can include a speaker (e.g., a piezoelectric speaker) that is coupled to the device housing in a manner that prevents sound from leaking from the speaker within the device. FIG. 4 is a schematic view of an illustrative device housing and seal in accordance with one embodiment of the invention. Device 400 can include housing 410, which can be manufactured from any suitable material. In some embodiments, housing 410 can include a curved or arbitrary shape to provide an aesthetically or cosmetically pleasing device exterior. Because housing 410 may have an unusual or complex shape, it may be difficult to manufacture a seal from a single material that simultaneously matches the shape of housing 410 while providing a resistant seal when subject to pressure or forces exerted by the user or by other components of the device. In particular, harder materials may be easier to form in the shape of housing 410, but may have limited travel or play when forces are applied to the materials. Alternatively, foams or softer materials may more easily deform in response to external forces, but may be difficult to manufacture in a manner to match the shape of housing 410.

To ensure that the seal both matches the shape of housing 410 and deflects sufficiently to absorb forces applied to the seal, the seal can be constructed from both a harder material manufactured to match the shape of housing 410 and a foam to deflect in response to external forces. For example, the seal can include foam element 420 and shaped element 430, such that shaped element 430 is placed in contact with housing 410 and foam element 420 is placed against the opposite side of shaped element 430 (e.g., shaped element 430 is between housing 410 and foam element 420). Shaped element 430 can be manufactured to match the shape of housing 410 from any suitable material, including for example from silicon, plastic, rubber, or any other suitable material.

Figure 5:
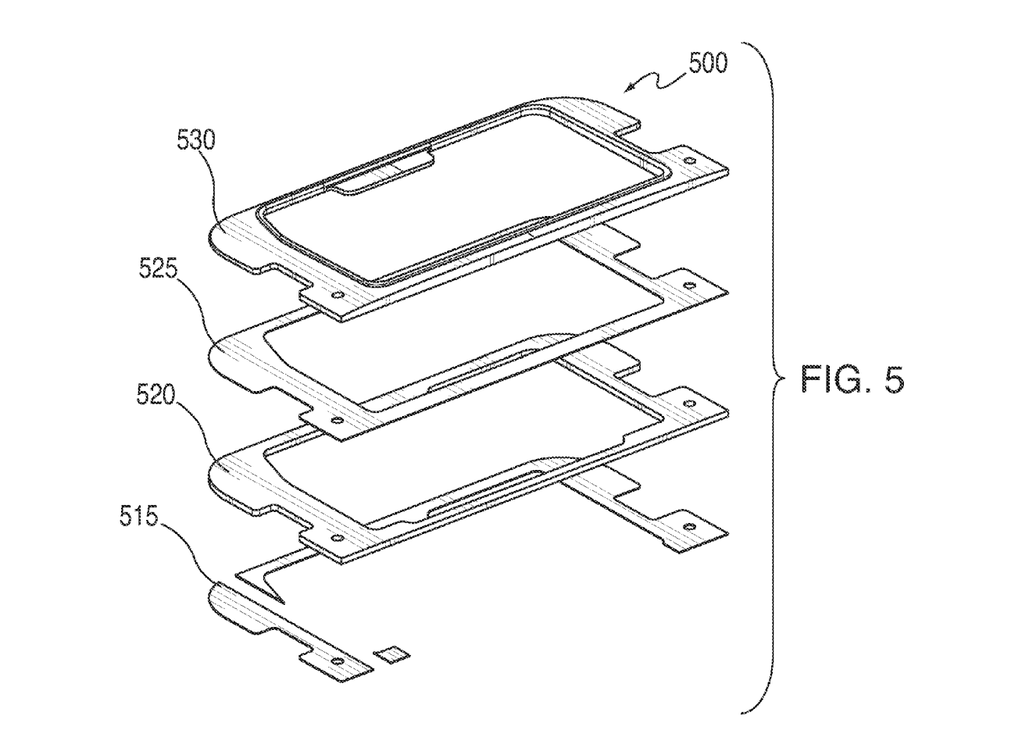
FIG. 5 is an exploded view of an illustrative seal for use in an electronic device in accordance with one embodiment of the invention.

FIG. 5 is an exploded view of an illustrative seal for use in an electronic device in accordance with one embodiment of the invention. Seal 500 can include foam element 520 and shaped element 530, which can include some or all of the features of the corresponding elements of FIG. 4. Foam element 520 can be coupled to shaped element 530 using any suitable approach, including for example using adhesive layer 525 (e.g., a pressure sensitive adhesive). Seal 500 can be coupled to an electronic device component (e.g., a speaker) using any suitable approach, including for example using a mechanical connector or an adhesive. In the example of FIG. 5, seal 500 can be coupled to a device component using adhesive layer 515. Similarly, seal 500 can be coupled to the housing using any suitable approach, including for example using a mechanical connector or an adhesive. In some embodiments, however, seal 500 and its attached device component can be retained against the housing from the pressure of other components or device elements pressing seal 500 against the housing.

Figure 6:
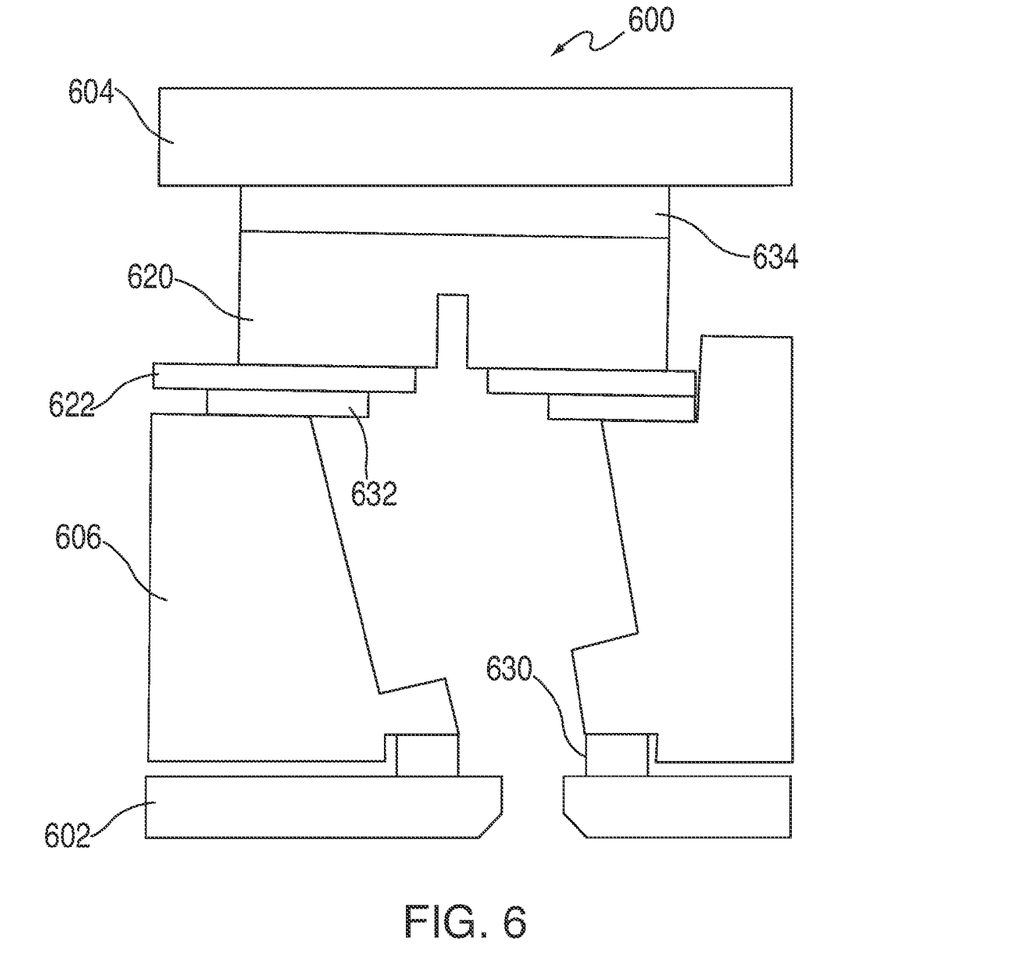
FIG. 6 is a cross-sectional view of an illustrative assembly for acoustically and mechanically isolating a microphone in accordance with one embodiment of the invention.

Other electronic device components may instead or in addition require acoustic and mechanical isolation from the other device components. For example, a microphone may need to be acoustically isolated so that only sounds from outside the electronic device are detected, as well as mechanically isolated to prevent vibrations or other noise generated by device components from interfering with the microphone operation. When the microphone is mounted directly to a circuit board, this may be especially necessary. FIG. 6 is a cross-sectional view of an illustrative assembly for acoustically and mechanically isolating a microphone in accordance with one embodiment of the invention. Device 600 can include microphone 620 mounted to circuit board 622 and placed between housing 602 and glass 604. Microphone 620 can be offset from housing 602 by mount 606, which can include a chamber for directing external sound to microphone 620. Mount 606 can be constructed from any suitable material, including for example from plastic.

To isolate microphone 620 from other components of electronic device 600, first foam layer 630 can be placed between housing 602 and mount 606. First foam layer 630 may be particularly effective for preventing audio from leaking from the chamber defined by mount 606 to other components of the device, and to prevent sound from other components from leaking into mount 606. To limit the noise transferred between mount 606 and circuit board 622, second foam layer 632 can be placed between circuit board 622 and mount 606. To prevent noise caused by tapping on glass 604 to propagate to microphone 620, third foam layer 634 can be placed between glass 604 and microphone 620.

Each layer of foam can be coupled to its adjacent components of electronic device 600 using any suitable approach. In some embodiments, an adhesive may be used. Alternatively, all of the components can be mounted between housing 602 and glass 604 such that a press fit occurs and the components press against each other to retain their respective positions within the electronic device. In some cases, a combination of these approaches or other approaches can be used to secure each layer of foam within electronic device 600.

Figure 7:
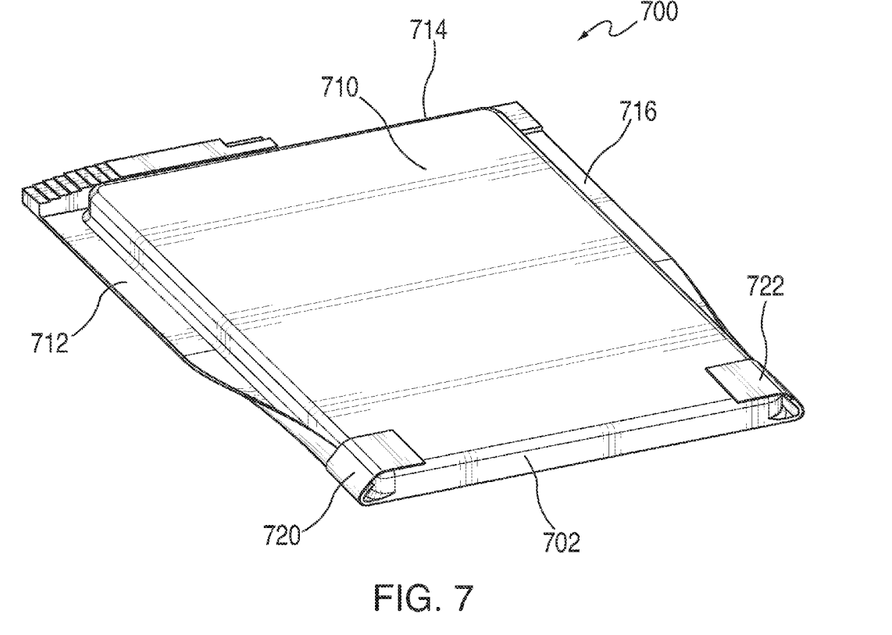
FIG. 7 is a schematic view of an illustrative battery used in an electronic device in accordance with one embodiment of the invention.

To power the electronic device, a battery can be placed within the device housing. The battery can be constructed using any suitable approach. In some embodiments, the battery can include a cell wrapped in a sheet of material. FIG. 7 is a schematic view of an illustrative battery used in an electronic device in accordance with one embodiment of the invention. Battery 700 can include cell 702 placed within sheet 710. sheet 710 can be wrapped around cell 702 such that opposing surfaces of sheet 710 are sealed. The resulting battery 700 can include sealed flaps 712, 714 and 716 extending around three sides of cell 702.

Flaps 712, 714 and 716 can be left down flat or folded up towards cell 702 to ensure proper placement of battery 700 in the electronic device. The decision to fold or leave the flaps down can depend, for example, on the position of other components within the device and relative to the battery. In some cases, however, other components can be placed such that the flaps must simultaneously remain flat and be folded up. To do so, different portions of the flaps can be folded up and retained using tape (e.g., tape 720 and 722). In the example of battery 700, portions of flaps 712 and 716 can be folded up and retained by tape 720 and 722 (e.g., portions adjacent to an end of battery 700), while the remaining parts of flaps 712 and 716, as well as flap 714 can remain flat.

The previously described embodiments are presented for purposes of illustration and not of limitation. It is understood that one or more features of an embodiment can be combined with one or more features of another embodiment to provide systems and/or methods without deviating from the spirit and scope of the invention. The present invention is limited only by the claims which follow.

The invention claimed is:

1. An electronic device comprising:
a housing;
a display positioned within the housing;
a window positioned over the display;
a flex within the housing and positioned below the window and comprising a fold defining an upper fold section and a lower fold section;
a first component, sensitive to interference, mounted on the lower fold section and oriented toward the window;
a support shield coupled the flex opposite the first portion, the support shield providing rigid support to the flex below the first component; and
a second component configured to emit electromagnetic energy and mounted on the lower fold section, separated from the first component, and oriented toward a back surface of the housing; wherein
the support shield is positioned between the first component and the second component so as to shield the first component from the electromagnetic energy generated by the first component.

2. The electronic device of claim 1, wherein the support shield is constructed from austenitic steel.

3. The electronic device of claim 1, wherein the first component is mounted on the flex via an SMT process.

4. The electronic device of claim 1, wherein the second component is mounted on the flex via an SMT process.

5. The electronic device of claim 1, wherein the support shield is permanently coupled to the flex.

6. The electronic device of claim 1, wherein the support shield is removably coupled to the flex.

7. The electronic device of claim 1, wherein the second component comprises a communications module.

8. The electronic device of claim 1, further comprising a third component mounted opposite the second component.

9. The electronic device of claim 8, wherein the flex is arranged such that the support shield separates the first component from both the second component and the third component.

10. An electronic device comprising:
a housing defining a perimeter region surrounding a display;
a flex within the housing positioned within the perimeter region, the flex folded along a fold axis so as to define an upper fold section positioned proximate to a front portion of the housing and a lower fold section positioned proximate to a back portion of the housing;
a coupling layer positioned on a first portion of a first surface of the flex within the upper fold section;
a first component electrically and mechanically coupled to the coupling layer;
a plate coupled to a second surface of the flex that is opposite the first portion, the plate providing rigid support to the first component via the flex; and
a second component configured to generate an RF signal and mounted on a second portion of the first surface of the flex within the lower fold section, the second component separated from the first component;
wherein the metal plate is positioned between the first component and the second component and provides an electromagnetic shield between the first component from the second component.

11. The electronic device of claim 10, wherein:
the plate is formed from metal; and
the coupling layer comprises a layer of solder.

12. The electronic device of claim 11, wherein:
the first component is coupled to the coupling layer an SMT process; and
the second component is mounted on the flex via an SMT process.

13. The electronic device of claim 11, further comprising a first connector coupled to the flex.

14. The electronic device of claim 13, wherein the first connector is adapted to receive a second connector coupled to a second flex.

15. The electronic device of claim 14, wherein:
the first connector is formed from the first flex; and
the second connector is formed from the second flex.

16. A method comprising:
coupling a first component to a first surface of a flex;
coupling a support shield a second surface to the flex opposite the first surface to provide structural support to the first component;
coupling a second component to the first surface of the flex; and
folding the flex such that the support shield is positioned between the first component and the second component;

disposing the flex within a housing of an electronic device such that the first component is proximate to a back surface of the housing and the second component is proximate a front surface of the electronic device, wherein:

the second component is configured to generate an RF emission; and the support shield is configured to shield the first component from the RF emission.

17. The method of claim 16, wherein the support shield is constructed from austenitic steel.

18. The method of claim 16, further comprising coupling the first component to the first portion of the first surface of the flex and coupling the second component to the second portion of the first surface of the flex using an SMT process.

19. The method of claim 16, further comprising permanently coupling the support shield to the flex.

* * * * *